(12) United States Patent
Johnson

(10) Patent No.: US 6,498,824 B1
(45) Date of Patent: Dec. 24, 2002

(54) PHASE CONTROL SIGNALS FOR CLOCK RECOVERY CIRCUITS

(75) Inventor: Luke A. Johnson, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/406,326

(22) Filed: Sep. 27, 1999

(51) Int. Cl.[7] .................................................. H03D 3/24
(52) U.S. Cl. ............................ 375/373; 327/12; 331/25
(58) Field of Search ................................. 375/340, 326, 375/327, 328, 371, 373, 374, 375, 376; 327/12, 141, 147, 150, 156, 159, 1–3; 331/25

(56) References Cited

U.S. PATENT DOCUMENTS

| | | | |
|---|---|---|---|
| 5,455,540 A | | 10/1995 | Williams ........................ 331/1 |
| 5,633,899 A | | 5/1997 | Fiedler et al. |
| 6,072,337 A | * | 6/2000 | Dalmia et al. ................. 327/12 |
| 6,081,572 A | * | 6/2000 | Filip ........................... 375/376 |
| 6,225,831 B1 | * | 5/2001 | Dalmia et al. ................. 327/12 |

* cited by examiner

Primary Examiner—Jean Corrielus
(74) Attorney, Agent, or Firm—Blakely, Sokoloff, Taylor & Zafman LLP

(57) ABSTRACT

The invention relates to a phase detector. The phase detector includes data sampling cells to sample a stream of serial data and generate primary data samples and also includes edge data sampling cells to sample the stream of serial data and generate edge data samples. The phase detector further includes phase detecting cells to generate phase control signals. Each phase detecting cell includes a first circuit to receive data and sampled edge data and to generate a first signal and a second signal. The first signal from a phase detecting cell is a delayed sampled edge data. The second signal from that phase detecting cell will be a delayed sampled edge data before data is sampled by the data sampling cell. Once data is sampled by the data sampling cell, the second signal from that phase detecting cell will be a secondary data sample. Each phase detecting cell also includes a comparator circuit to receive the first signal and second signal and to generate a phase control signal therefrom.

20 Claims, 4 Drawing Sheets

PHASE CONTROL SIGNALS FOR CLOCK RECOVERY CIRCUITS

BACKGROUND OF THE INVENTION a. Field of the Invention

The present invention relates to electronic circuits. More specifically, the present invention relates to data capture and clock recovery.

b. Background Information

Phase detectors and phase locked loops may be used in integrated circuits for clock synchronization and recovery of serial data streams. Because of variations in the fabrication process, operating temperatures, power supply levels, and interconnection routings, individual clock delays may be different from one integrated circuit to the next. These differences may create a clock skew between each integrated circuit and a system clock or serial data stream. Clock skew may significantly degrade system performance and may make it difficult to synchronize an individual edge with the system clock edge.

To minimize clock skew and achieve synchronization, a phase locked loop (PLL) may be used to track the system clock or incoming serial data stream, compare it with an on-chip clock, detect any phase or frequency difference, and then make any necessary adjustments to the on-chip clock until the on-chip clock matches the system clock. When this occurs, the phase locked loop may be "locked-on" to the system clock. After every integrated circuit in the system is synchronized with the system clock, the entire system may work in unison. If the operating conditions in the system should change, such as a temperature increase that degrades performance, the PLL may continue to track the system clock to restore normal operation.

A typical PLL may include a phase detector, a charge pump, a loop filter, and a voltage control oscillator (VCO). One type of phase detector is known as "bang-bang" phase detector. This technique uses a two times oversampling technique to detect phase error. In a bang-bang phase detector, the data stream may be sampled twice: once at the optimal sampling point, known as the center of the eye, and again as data switches to a different logic level, known as the edge transition. In other words, for data comprising one bit sent every nanosecond, the one bit may be sampled twice per nanosecond. By comparing the data sampled at the center of the eye with the data sampled as the data is switching, a determination may be made as to whether the system clock is leading or lagging the switch point of the data (here, the edge transition).

If the sampled data is different than the value sampled during the prior transition, i.e., during the prior edge transition, then the edge transition sample is made before the data changes to its new value. Thus, the system clock is leading. In this case, the phase detector generates a down signal to decrease the speed of the system clock. Likewise, if the sampled data is different than the value sampled during the following edge transition, then the clock is lagging. Here, the phase detector generates an up signal to increase the speed of the system clock.

This bang-bang determination may be used to tune an oversampling clock to occur exactly as the data is switching. Since the data-sampling clocks occur between each oversampling clock (in the middle), a sample may be guaranteed of the exact center of the eye. However, a problem with this bang-bang phase detector is that the up and down control signals generated by the phase detector take a relatively long time to be validated, making the clock recovery circuit harder to stabilize.

DETAILED DESCRIPTION

In the following description, numerous specific details are set forth to provide a thorough understanding of the present invention. However, one having ordinary skill in the art will recognize that the invention may be practiced without these specific details. In some instances, well-known circuits, structures, and techniques have not been shown in detail to avoid obscuring the present invention.

Figure 1:
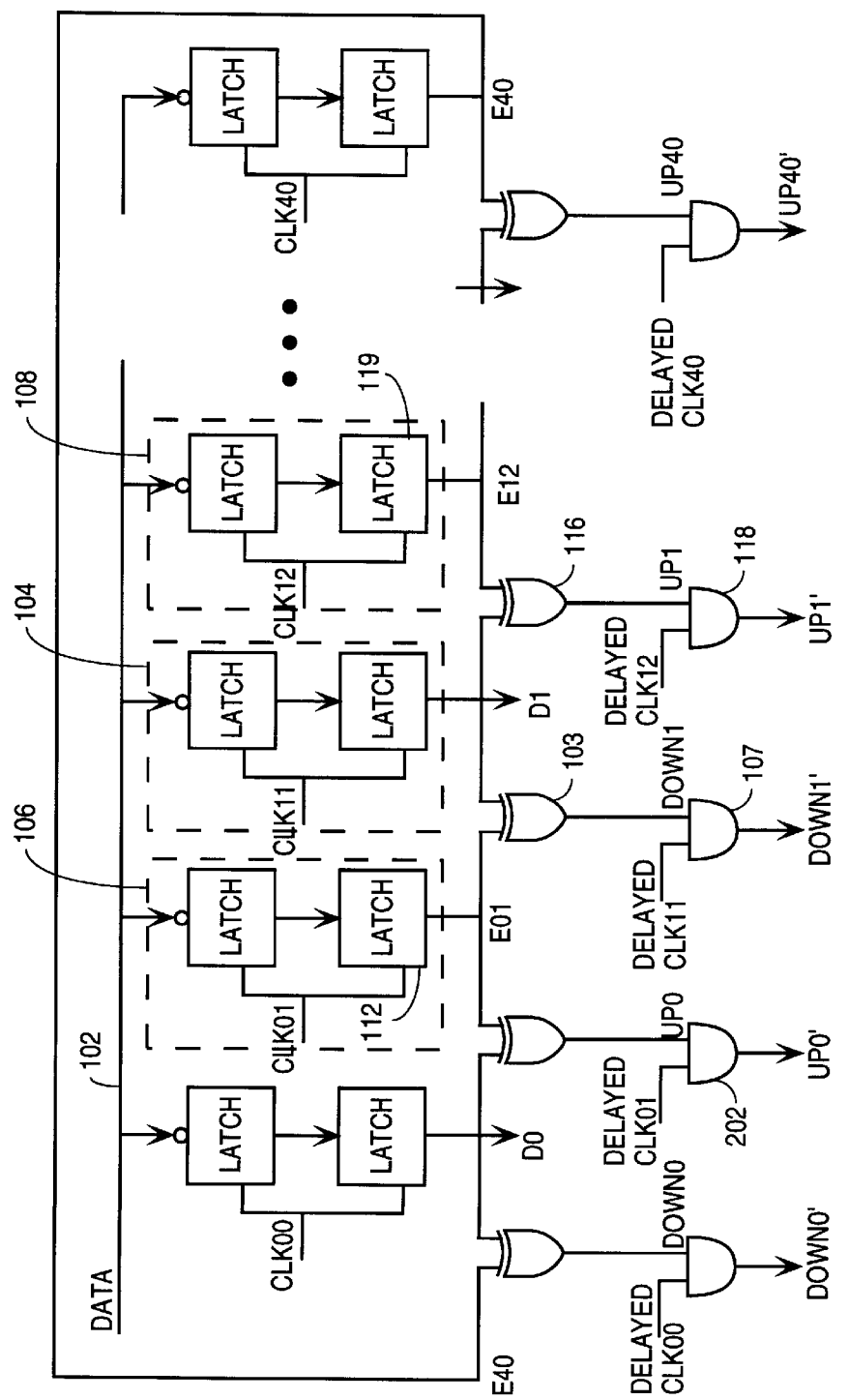
FIG. 1 illustrates a typical two times oversampling phase detector.

FIG. 1 illustrates a typical two times (2x) oversampling phase detector 100. Phase detector 100 may be a detector as suggested by U.S. Pat. No. 5,455,540, entitled Modified Bang-Bang Phase Detector with Ternary Output. Phase detector 100 may employ a series of ten master-slave high-speed capture latch pairs to output down and up signals that control a charge pump and filter of a clock recovery circuit.

Data 102 may be delivered to each latch pair of FIG. 1. For example, data signal 102 may be delivered to latch pair 106 and latch pair 104. The output of these two adjacent latch pairs may be compared to produce either a down signal or an up signal.

For latch pairs 106 and 104, edge data signal 01 ("e01"), clock signal 01 ("clk01"), data signal 1 ("d1"), clock signal 11 ("clk11"), and data signal 102 may be used to obtain the unqualified signal down1. Data signal 102 (one bit) is first latched by latch pair 106 after the signal clk01 transitions from 0 to 1. The signal clk01 transitions from 0 to 1 at a point in time that coincides with the edge of data signal 102, namely edge data signal e01. Note that the bubble shown on the top of one latch in each latch pair of FIG. 1 indicates that one latch is enabled during the phase opposite the second latch.

Next, data signal 102 is latched by latch pair 104 at a point in time after the transition of the clock signal clk11 from 0 to 1. This transition of clock signal clk11 from 0 to 1 is designed to coincide with the center of the eye of data signal 102, namely data signal d1. Therefore, signals clk01 and clk11 are slightly out of phase. In other words, the difference in phase translated in time units is substantially equal to the time between the occurrence of an edge in data signal 102 and. occurrence of the next center of the eye for data signal 102.

Once data signal d1 is sampled with clock signal clk11 of latch pair 104, data signal d1 is compared to the edge data signal e01 from latch pair 106 to determine whether d1 and e01 are at different logic levels, i.e., at 0 and 1, or 1 and 0. The signals d1 and e01 may be compared by way of an exclusive-or (XOR) gate 103 that receives at its input ports the signals d1 and e01. If the data signal d1 is different from the edge data signal e01, XOR gate 103 outputs an unqualified down1 signal that is set to logic 1.

The unqualified down1 signal is then qualified with the delayed clock signal 11 (delayed clk11). The delayed clk11 is delayed to account for two propagation delays: the propagation delay of data signal 102 sampled at the center of the eye through the slave latch 112 of latch pair 106 and the propagation delay through XOR gate 103. This delay in delayed clk11 must also have a margin to allow for clock skew effects.

The delayed clk11 and unqualified down1 signal are driven to the input ports of AND gate 107. AND gate 107 passes the unqualified down1 signal to its output port when the delayed clk11 is at logic 1 so as to qualify the down1 signal as down1'. In doing so, it is ensured that no glitch occurs in the down1' signal before data signal 102 propagates to the output port of slave latch 112. The up1' signal similarly may be output by AND gate 118 by comparing the data signal d1 of latch pair 104 with the edge signal e12 of latch pair 108 through XOR gate 116. Phase detector 100 takes time to generate each up and down signal due to the three stage delay caused by the slave latch, the XOR gate, and the AND gate.

Figure 2:
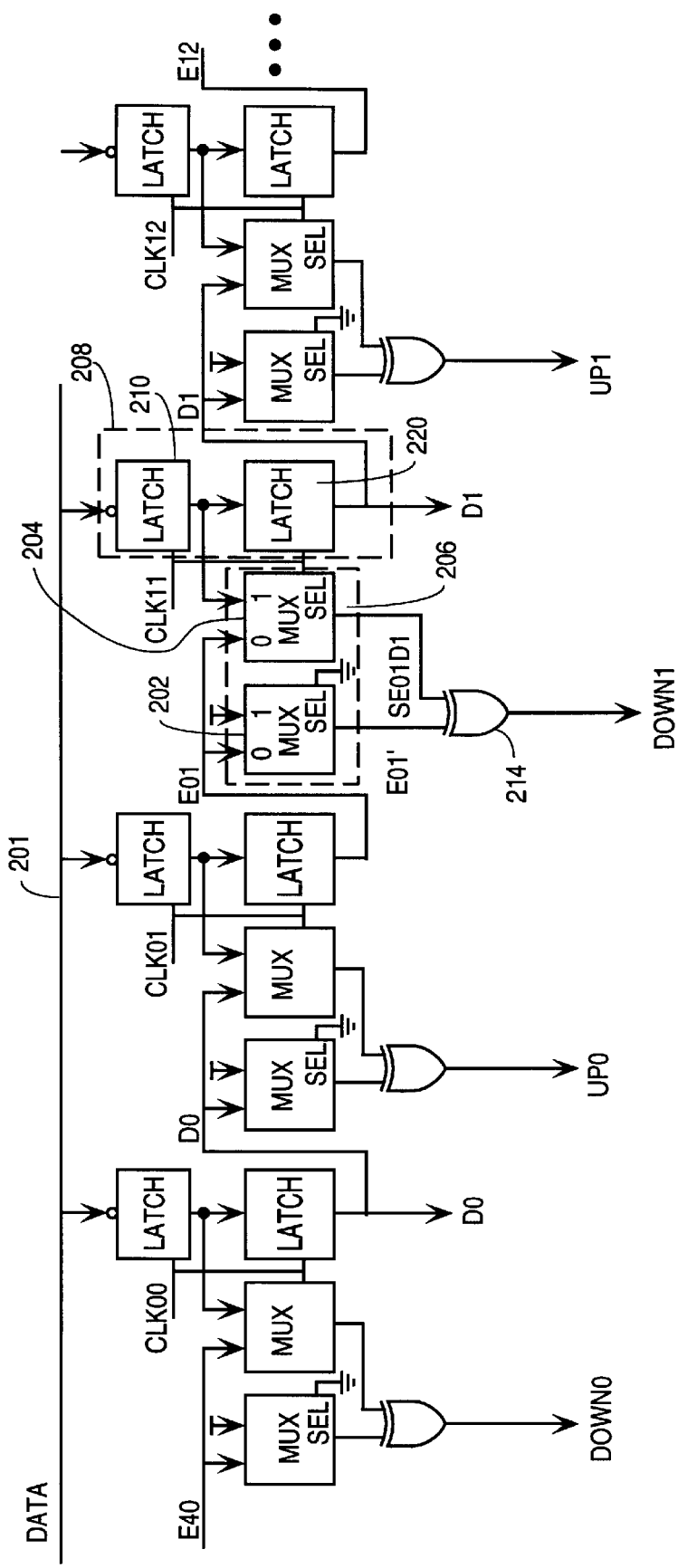
FIG. 2 illustrates an embodiment of a phase detector according to the present invention.

FIG. 2 illustrates an embodiment of a phase detector according to the present invention. Circuit 200 of FIG. 2 works to remove the clock skew requirements for the AND gate of phase detector 100 and also works towards reducing the three stage delay by presenting two stages instead of three stages through elimination of the AND gate.

Circuit 200 may include data signal 201, latch pair 208, multiplexer pair 206, and XOR gate 214. Latch pair 208 may include first latch 210 coupled by ports between an input line on which data signal 201 may reside and an output line that may feed in series to second latch 220. Clock data signal 11 ("clk11") may feed into input ports of first latch 210 and second latch 220. Moreover, second latch 220 may output data signal 1 ("d1") through an output port.

Multiplexer pair 206 may include a pair of multiplexers 202 and 204. Both multiplexer 202 and multiplexer 204 may receive at an input port an edge data signal e01. Multiplexer 204 may also receive at an input port the output signal from first latch 210. In this way, once data signal 201 is sampled by first latch 210, data signal 201 is presented to an input port of the multiplexer 204. A select input ("sel") of multiplexer 204 may receive clock data signal clk11. An output port of multiplexer 204 may be directed to an input port of XOR gate 214 as a selection ("s") between the edge data signal e01 ("e01") and the data signal d1 ("d1") from first latch 210. Thus, the nomenclature selected to represent this output signal is "se01d1".

Multiplexer 202 may also receive at an input port a "don't care" signal. Multiplexer 202 may be indifferent to this don't care signal. A select ("sel") input port of multiplexer 202 may be directed to ground. Moreover, an output port of multiplexer 202 may be directed to an input port of XOR gate 214 as delayed edge signal E01'.

Due to a propagation delay through multiplexer 202, the output edge signal e01' may transition from 0 to 1 shortly after the input edge signal e01 transition from 0 to 1. Thus, edge signal e01' may be referred to as a delay of edge signal e01 or delayed edge signal e01'. Directing the select input port to. ground ensures that multiplexer 202 always directs the e01 signal to the output port of multiplexer 202 as e01'. Therefore, multiplexer 202 may provide a delay equal to the delay through multiplexer 204.

As shown in FIG. 2, a line may carry clock signal clk11 to the select input port of multiplexer 204 and to an input port of second latch 220. As a result, prior to a 0–1 transition of clock signal clk11, multiplexer 204 may receive at the select input port a logic 0 signal. A logic 0 signal may cause multiplexer 204 to provide on its output port the signal e01'.

Recall that multiplexer 204 may generate at its output port the signal se01d1. Output signal se01d1 may track input signal e01 where clock signal clk11 is set to logic 0. Since multiplexer 204 may experience delays similar to multiplexer 202, output se01d1 of multiplexer 204 may be a delayed version of the input signal e01 where clock signal clk11 is set to logic 0. Accordingly, the signal e01' at the output of multiplexer 202 does not have to wait for signal data d1 to stabilize and be valid.

Recall that directing the select input of multiplexer 202 to ground ensures that multiplexer 202 always selects the e01 signal to deliver to the output port of multiplexer 202. With output se01d1 of multiplexer 204 as a delayed version of the input signal e01 and output e01' of multiplexer 202 being a delayed version of the input signal e01, the inputs to XOR gate 214 may be the same when clock signal clk11 is set to logic 0, Where the inputs to XOR gate 214 are similar, XOR gate 214 outputs a logic 0 as signal down1 so as to avoid possible glitches due to the propagation delays of the data to the output port of latch pair 208.

When the signal of clock clk11 rises to logic 1, multiplexer 204 may select, at its output port se01d1, the signal received from first latch 210. The signal received by multiplexer 204 from first latch 210 is the data signal d1 after it has been passed through the first latch 210. Where multiplexer 204 works in parallel with second latch 220, data d1 becomes valid at the se01d1 output port of multiplexer 204 at approximately the same time that data d1 becomes available at the d1 output port of second latch 220. Therefore, XOR gate 214 may receive at one of its input ports the valid data signal d1. Where the data signal d1 is substantially the same as the edge signal e01', XOR gate 214 may provide to its output port a logic 0 signal. However, where the data signal d1 is different from edge signal e01', XOR gate 214 may drive the output signal down1 to a logic 1. In this way, the pair of multiplexers 202 and 204 may accomplish the desired function of an AND circuit without causing the unnecessary delay that accompanies the inclusion of an AND gate in a phase detector.

The structure explained above may also apply to the generation of other up and down signals. As shown in FIG. 2, circuit 200 may also include other signal generation groups. Similar to the signal generation group described above, these signal generation groups may include latch pairs, multiplexer pairs, and XOR gates to generate other up and down signals. The output of a second latch of a signal generation group may be the edge e01 input signal of an adjacent multiplexer group, such as multiplexer group 206. Moreover, output d1 of second latch 220 may be a data input signal of an adjacent multiplexer pair of an adjacent signal generation group. Each signal generation group may be circuitry that is similar in structure to latch pairs 208, multiplexer pairs 206, and XOR gate 214.

Figure 3:
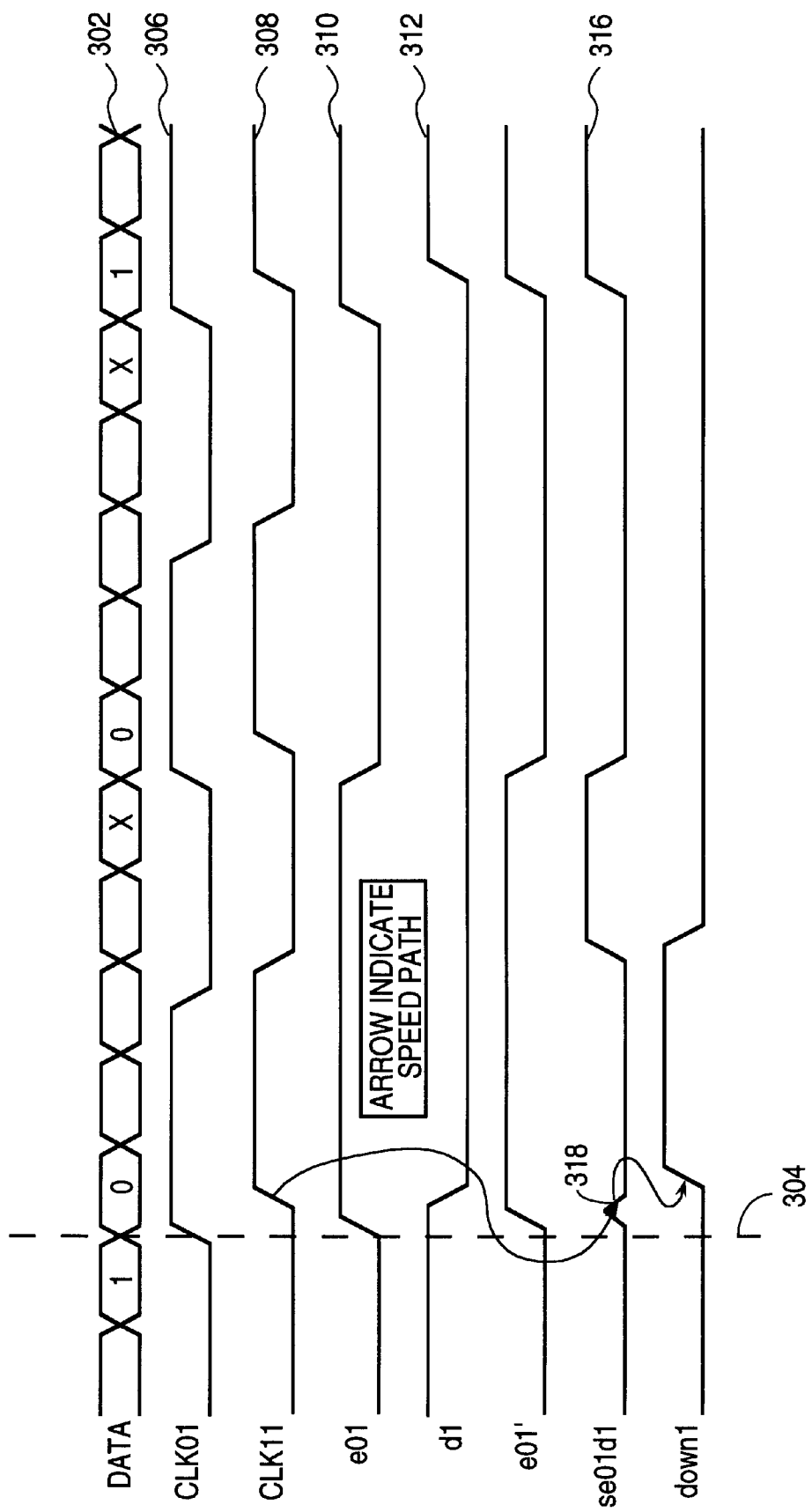
FIG. 3 is a waveform diagram in connection with different signals provided to and generated by a phase detector circuit.

FIG. 3 illustrates a waveform diagram in connection with the different signals provided to and generated by circuit 200 of FIG. 2. Waveform or data 302 may represent data signal 201 of circuit 200. In one illustrative example, data signal 302 may transition from logic 1 to logic 0 at a point in time represented by dotted line 304. Data signal 302 may be sampled at its new logic value 0 when signal clk11 308 transitions from logic 0 to logic 1, i.e., approximately close to the middle of the eye of data signal 302. Clock signal clk01 306 may sample data signal 302 at the edge transition from logic 1 to logic 0 where line 304 is shown. Shortly after the transition of clock signal clk01 306 from logic 0 to logic 1, the edge signal e01 310 may transition from logic 0 to logic 1. The data signal d1 312 may transition from logic 1 to logic 0 shortly after the transition of the clock signal clk11 308 from logic 0 to logic 1. Signal e01', which may be output by multiplexer 202, may transition from logic 0 to logic 1 shortly after the signal e01 310 transition from logic 0 to logic 1. The delay between the transition of the signal e01' and the transition of signal e01 may be due to the propagation delay through multiplexer 202 of FIG. 2.

Signals se01d1 316 and e01 310 may be set to logic 0 for a portion of time to the left of line 304 where clock signal clk01 306 is logical 0. Here, multiplexer 204 of FIG. 2 may select the edge transition data e01 310 that may be logic 0 at the left of line 304. After the occurrence in time represented by line 304, i.e., to the right of line 304, clock signal clk11 308 may still be logic 0 and, therefore, the signal se01d1 316 may have the same logic value as edge signal e01 310 up to the time when clock signal clk11 308 becomes a logic 1. Once the delayed edge signal e01' starts transitioning from logic 0 to 1, signal se01d1 316 may also transition from logic 0 to logic 1. However, when the clock signal clk11 308 has become logic 1, signal se01d1 316 may follow data signal d1 312. The data signal d1 312 may be logic 0 when clock signal clk11 308 has transitioned to logic 1. Therefore, there may be a pulse 318 as shown in FIG. 3. Pulse 318 may occur because edge data signal e01 310 may be available before data signal d1 312. Pulse 318 may be necessary to ensure that the output of an XOR gate in circuit 200 of FIG. 2 does not glitch while waiting for data signal d1 312 of FIG. 3 to become available.

Figure 4:
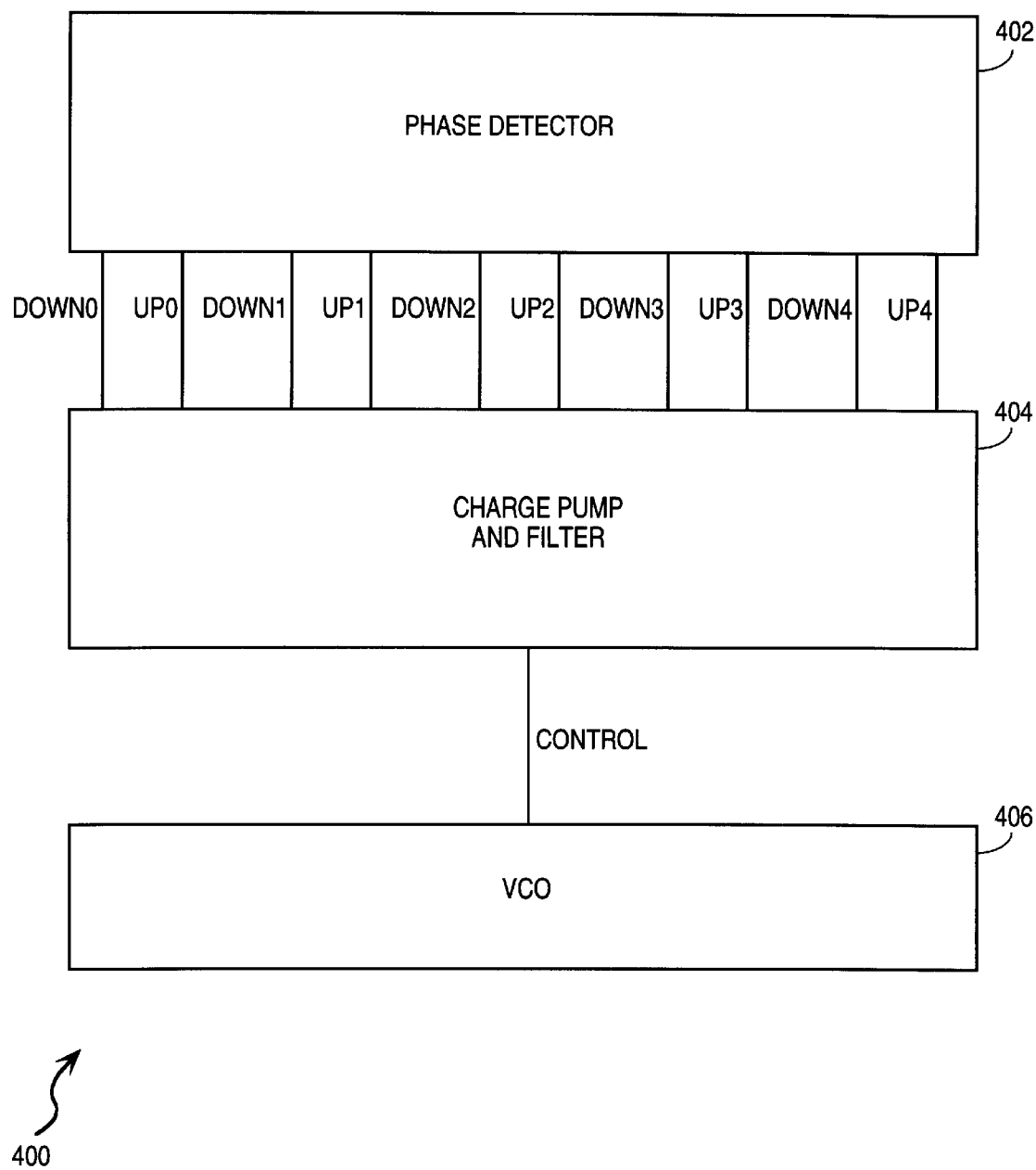
FIG. 4 is a block diagram of a clock recovery circuit.

FIG. 4 is a block diagram of clock recovery circuit 400. Clock recovery circuit may include phase detector 402, charging pump and filter 404 coupled to phase detector 402 through serial data lines, and voltage control oscillator (VCO) 406 coupled to charging pump and filter 404. An example of a serial data line is the output line from XOR gate 214 of FIG. 2.

VCO 406 may generate within an on-chip clock, a phase and frequency that may be the function of the voltage applied to VCO 406. Phase detector 402 may detect a phase or frequency difference between the serial data stream and the output of VCO 406. Phase detector 402 may generate a phase control signal as a function of this detected difference and may send this phase control signal to charge pump and filter 404. Charge pump and filter 404 may then control the voltage used by VCO 406 so as to increase or decrease the oscillation frequency of VCO 406.

In the previous detailed description, the invention is described with reference to specific embodiments thereof. It will, however, be evident that various modifications and changes may be made thereto without departing from the broad scope oft he claim terms. The specification and drawings are, accordingly, to be regarded in an illustrative rather than a restrictive sense.

What is claimed is:

1. A clock recovery circuit, comprising:
   a voltage control oscillator;
   a filter circuit coupled to the voltage control oscillator; and
   a phase detector coupled to the filter circuit, the phase detector including
      a first latch having a data input, a clock input, and an output,
      a first multiplexer having at least first and second data inputs, a data output, and a select input coupled to ground such that the first multiplexer always selects the first data input of the first multiplexer,
      a second multiplexer having a first input coupled in parallel with the data input of the first multiplexer, a second input coupled to the output of the first latch, a select input coupled in parallel with the clock input of the first latch, and an output, and
      an exclusive-or gate having a first input coupled to the data output of the first multiplexer, a second input coupled to the output of the second multiplexer, and an output.

2. The clock recovery circuit of claim 1, wherein the second data input of the first multiplexer includes a don't care input.

3. The clock recovery circuit of claim 1, wherein the phase detector further including a second latch having a first input coupled to the output of the first latch, a second input coupled in parallel with the clock input to the first latch, and an output.

4. The clock recovery circuit of claim 3, wherein the phase detector further including a signal generation group having a first input coupled in parallel with the data input of the first latch and a first output coupled to the data input of the first multiplexer.

5. The clock recovery circuit of claim 4,
   wherein the signal generation group further includes
      a first latch having a clock input and an output, and
      a second latch having a first input coupled to the output of the first latch of the signal generation group, a second input coupled in parallel with the clock input of the first latch of the signal generation group, and an output,
   wherein the first input of the signal generation group is coupled to the first latch of the signal generation group and the first output of the signal generation group is coupled to the output of the second latch of the signal generation group.

6. The clock recovery circuit of claim 5, wherein
the signal generation group further includes
- a first multiplexer having a data input, a data output, and a select input coupled to ground such that the first multiplexer of the signal generation group always selects the data input of the first multiplexer of the signal generation group,
- a second multiplexer having a first input coupled in parallel with the data input of the first multiplexer of the signal generation group, a second input coupled to the output of the first latch of the signal generation group, a select input coupled in parallel with the clock input of the first latch of the signal generation group, and an output, and
- an exclusive-or gate having a first input coupled to the data output of the first multiplexer of the signal generation group, a second input coupled to the output of the second multiplexer of the signal generation group, and an output.

7. The clock recovery circuit of claim 1, wherein the phase detector further including
- a second latch having a first input coupled to the output of the first latch, a second input coupled in parallel with the clock input to the first latch, and an output, and
- a first signal generation group having a first input coupled in parallel with the data input of the first latch, a second input coupled to the output of the second latch, and a first output.

8. The clock recovery circuit of claim 7,
wherein the first signal generation group further includes
- a first latch having a clock input and an output, and
- a second latch having a first input coupled to the output of the first latch of the first signal generation group, a second input coupled in parallel with the clock input of the first latch of the first signal generation group, and an output,
wherein the first input of the first signal generation group is coupled to the first latch of the first signal generation group and the first output of the first signal generation group is coupled to the output of the second latch of the first signal generation group.

9. The clock recovery circuit of claim 8, wherein the first signal generation group further includes
- a first multiplexer having at least first and second data inputs, a data output, and a select input coupled to ground such that the first multiplexer of the first signal generation group always selects the first data input of the first multiplexer of the first signal generation group,
- a second multiplexer having a first input coupled in parallel with the data input of the first multiplexer of the first signal generation group, a second input coupled to the output of the first latch of the first signal generation group, a select input coupled in parallel with the clock input of the first latch of the first signal generation group, and an output, and
- an exclusive-or gate having a first input coupled to the data output of the first multiplexer of the first signal generation group, a second input coupled to the output of the second multiplexer of the first signal generation group, and an output.

10. A circuit comprising:
- a first latch having a data input, a clock input, and an output;
- a first multiplexer having a data input, a data output, and a select input coupled to ground such that the first multiplexer always selects the data input of the first multiplexer;
- a second multiplexer having a first input coupled in parallel with the data input of the first multiplexer, a second input coupled to the output of the first latch, a select input coupled in parallel with the clock input of the first latch, and an output; and
- an exclusive-or gate having a first input coupled to the data output of the first multiplexer, a second input coupled to the output of the second multiplexer, and an output.

11. The circuit of claim 10, wherein the first multiplexer further includes a don't care input.

12. The circuit of claim 10, further comprising a second latch having a first input coupled to the output of the first latch, a second input coupled in parallel with the clock input to the first latch, and an output.

13. The circuit of claim 10 further comprising:
- a signal generation group having a first input coupled in parallel with the data input of the first latch and a first output coupled to the data input of the first multiplexer.

14. The circuit of claim 13 wherein the signal generation group further includes
- a first latch having a clock input and an output, and
- a second latch having a first input coupled to the output of the first latch of the signal generation group, a second input coupled in parallel with the clock input of the first latch of the signal generation group, and an output,
wherein the first input of the signal generation group is coupled to the first latch of the signal generation group and the first output of the signal generation group is coupled to the output of the second latch of the signal generation group.

15. The circuit of claim 14
wherein the signal generation group further includes
- a first multiplexer having a data input, a data output, and a select input coupled to ground such that the first multiplexer of the signal generation group always selects the data input of the first multiplexer of the signal generation group,
- a second multiplexer having a first input coupled in parallel with the data input of the first multiplexer of the signal generation group, a second input coupled to the output of the first latch of the signal generation group, a select input coupled in parallel with the clock input of the first latch of the signal generation group, and an output, and
- an exclusive-or gate having a first input coupled to the data output of the first multiplexer of the signal generation group, a second input coupled to the output of the second multiplexer of the signal generation group, and an output.

16. The circuit of claim 10 further comprising:
- a second latch having a first input coupled to the output of the first latch, a second input coupled in parallel with the clock input to the first latch, and an output; and
- a signal generation group having a first input coupled in parallel with the data input of the first latch and a second input coupled to the output of the second latch.

17. A method comprising:
delivering a first signal to a data input of a first latch, the first latch further having a clock input and an output,
receiving a second signal at a data input of a first multiplexer, the first multiplexer further having a data output and a select input coupled to ground such that the first multiplexer always selects the data input of the first multiplexer;

receiving the second signal at a first input of a second multiplexer, the second multiplexer further having a second input coupled to the output of the first latch, a select input coupled in parallel with the clock input of the first latch, and an output;

delivering a clock signal to the clock input of the first latch;

delivering the clock signal to the select input of the second multiplexer;

in response to receiving the second signal at the data input of the first multiplexer, delivering a third signal from the first multiplexer to a first input of an exclusive-or gate, the exclusive-or gate having a second input coupled to the output of the second multiplexer; and in response to the clock signal, delivering to the second input of the exclusive-or gate one of an output signal from the first latch and a fourth signal, the fourth signal being in response to receiving the second signal at the first input of the second multiplexer.

18. The method of claim 17, further comprising delivering the output signal from the first latch to a first input of a second latch, the second latch having an output and having a second input coupled in parallel with the clock input to the first latch.

19. The method of claim 18 further comprising:

in response to the clock signal, delivering an output signal from the second latch to a second input of a signal generation group, the signal generation group having a first input coupled in parallel with the data input of the first latch.

20. The method of claim 17, wherein receiving the second signal at the data input of the first multiplexer and receiving the second signal at the first input of the second multiplexer, includes sending the second signal from a first output of a signal generation group, the signal generation group further having a first input coupled in parallel with the data input of the first latch.

* * * * *